(12) United States Patent
Burger, Jr. et al.

(10) Patent No.: US 6,275,090 B1
(45) Date of Patent: Aug. 14, 2001

(54) ADAPTIVE RESISTOR TRIMMING CIRCUIT

(75) Inventors: Harley Franklin Burger, Jr., Sunnyvale, CA (US); Jeffrey Lee Sonntag, Rockland Township, Berks County, PA (US); Suharli Tedja, Fremont, CA (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/176,279

(22) Filed: Apr. 9, 1997

Related U.S. Application Data

(63) Continuation of application No. 08/573,012, filed on Dec. 15, 1995, now abandoned.

(51) Int. Cl.[7] .................................................. G06F 5/00
(52) U.S. Cl. ................................................ 327/334; 323/316
(58) Field of Search .................................... 327/334, 336, 327/538, 540, 541, 543, 539, 361; 323/314, 315, 316

(56) References Cited

U.S. PATENT DOCUMENTS

| | | | |
|---|---|---|---|
| 4,085,374 | * 4/1978 | Nagahama | 327/100 |
| 4,645,948 | 2/1987 | Morris et al. | 307/296 |
| 4,849,684 | 7/1989 | Sonntag et al. | 323/313 |
| 5,107,199 | * 4/1992 | Vo et al. | 323/316 |
| 5,245,229 | * 9/1993 | Colvin, Sr. | 327/361 |
| 5,254,883 | * 10/1993 | Horowitz et al. | 326/30 |
| 5,373,226 | * 12/1994 | Kimura | 323/313 |
| 5,442,314 | * 8/1995 | Hara | 327/543 |
| 5,444,412 | * 8/1995 | Kowalski | 327/541 |
| 5,471,208 | 11/1995 | Sauer | 341/120 |

FOREIGN PATENT DOCUMENTS

| | | | |
|---|---|---|---|
| 0 718 887 A1 | 6/1996 | (EP) | H01L/27/08 |
| 96308724 | 5/1997 | (EP) . | |
| 57-28227 | 2/1982 | (JP) | G01K/7/16 |

OTHER PUBLICATIONS

Patent Abstract of Japan, Publication No. 63179563, dated Jul. 23, 1988, H. Takaai; Class.: H011 27/04, Translation: Abstract only.

* cited by examiner

*Primary Examiner*—My-Trang Nu Ton
(74) *Attorney, Agent, or Firm*—James H. Fox; Mark A. Kurisko

(57) ABSTRACT

An integrated circuit includes a self-calibrating resistor circuit comprising a resistor string, a comparator, a state machine, a reference voltage source, and a reference current source. The current source typically comprises a voltage reference, typically a bandgap reference, and a temperature-independent resistor having a value $R_{EXT}$. In operation, a reference current $I_{REF}$ flows through the resistor string. During a calibration period, the voltage across the string is compared to the bandgap reference voltage, $V_{BG}$, by the comparator, which controls the state of the state machine. The outputs of the state machine turn on or off the resistors in the string until the voltage across the string, $V_R$, is approximately equal to the reference voltage. The resistance of the resistor string is then equal to $R_{BG}=V_{BG}/I_{REF}$, which is proportional to $R_{EXT}$, and thus is typically independent of process and temperature. The final state of the state machine that produces $R_{BG}$ may be used to control any resistor strings on the integrated circuit that need to be temperature and process independent. The calibration period may be repeated from time to time to track temperature variations.

16 Claims, 3 Drawing Sheets

ADAPTIVE RESISTOR TRIMMING CIRCUIT

This application is a continuation of application Ser. No. 08/573,012, filed on Dec. 15, 1995 Abn.

BACKGROUND OF THE INVENTION

1. Field of the Invention

The present invention relates to an integrated circuit (IC) having a trimless resistor.

2. Description of the Prior Art

Integrated circuits employ resistors formed by a variety of materials and processes. For example, a deposited doped polysilicon resistor that overlies a semiconductor substrate may be used. In other cases, a doped region in the semiconductor substrate itself may be used as the resistor. A heavily doped region formed by the same diffusion process that forms the source and drain regions may be used when a relatively low resistivity is desired. A less heavily doped tub region may be used as the resistor where a higher resistivity is desired. For example, an n-doped tub region may be used to form an "NTUB" resistor when a relatively large resistance value is desired. However, the NTUB resistor has a relatively poor temperature coefficient. For example, in one typical integrated circuit fabrication process implemented in 0.5 micron CMOS technology, the resistance value increases by 55 percent over a temperature range of from 10 degrees to 110 degrees centigrade.

It is known in the integrated circuit art to trim resistors to obtain a relatively more precise value. For example, "trim links" are resistive regions in series that can be selectively bypassed during a trimming operation to obtain the desired resistance value. The trimming may be accomplished by application of a large electrical current in some cases. However, that requires extra bondpads on the IC for supplying the current, which is undesirable in many cases. However, in the case of the above-noted resistor types, and especially the tub resistor types, the temperature coefficient is so poor that trimming these resistors using trim links does not achieve the desired result, since trimming is done at only one temperature. In many cases, relatively constant resistor values as a function of temperature are desired, as in the case of resistors used in setting filter coefficients in analog circuits, for example.

SUMMARY OF THE INVENTION

An integrated circuit includes a calibration resistor having a controllable resistance, a voltage source, a current source, a comparator, and control circuitry. In operation, current from the current source flows through the calibration resistor. The voltage across the calibration resistor is compared to the voltage from the voltage source, and the control circuitry controls the resistance of the calibration resistor so that these voltages are approximately equal. In this manner, the resistance of the calibration resistor is made to approximate the ratio of the voltage from the voltage source to the current from the current source. The control circuitry may be used to control various controlled resistors on the integrated circuit. The current source is typically derived from a temperature-independent resistor that is external to the integrated circuit.

DETAILED DESCRIPTION

Figure 1:
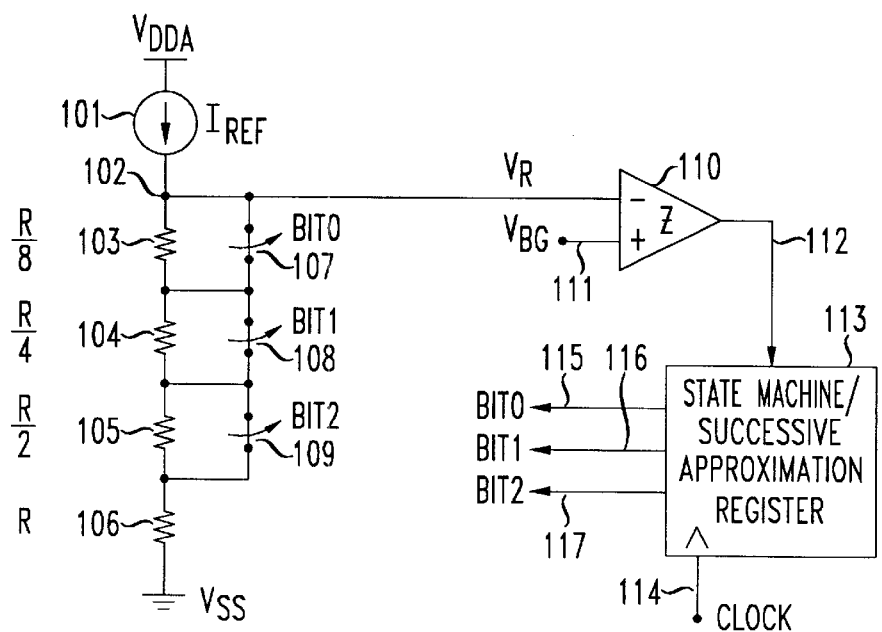
FIG. 1 shows an illustrative embodiment of the invention.

The following detailed description relates to a technique for implementing a self-calibrating resistor on an integrated circuit. Referring to FIG. 1, an illustrative embodiment of the invention is shown. A reference current source 101 provides a reference current $I_{REF}$ that flow through a series string of calibration resistors 103, 104, 105 and 106. Node 102 at the top of the string is connected to the inverting input of comparator 110, whereas a voltage $V_{BG}$, illustratively from a bandgap reference, is provided to the non-inverting input 111. The comparator output is a binary value that is either high or low depending on whether the voltage on input 111 is greater or less then the voltage $V_R$ on node 102. The comparator output is supplied on line 112 to control logic 113. The control logic includes a state machine that performs as a successive approximation register for controlling the outputs BIT0, BIT1, and BIT2 on lines 115, 116 and 117, respectively. The state machine is stepped through a sequence of states under the control of a clock provided on line 114, as more fully explained below.

Switches 107, 108 and 109 are placed across calibration resistors 103, 104 and 105, respectively. Each of the switches when closed forms a relatively low-impedance path around the corresponding resistor, being then effectively a short that produces approximately a zero voltage drop. Each switch when open has a relatively high impedance, providing for a voltage drop across the corresponding resistor according to its resistance value. The total voltage drop across the resistor string is the voltage $V_R$ at node 102 with respect to ground ($V_{SS}$). It can be seen that $V_R = I_{REF} * R_{SUM}$, where $R_{SUM}$ is the effective resistance of the resistor string, being the sum of the resistor values whose corresponding switches are open. Each switch is controlled by the corresponding output (BIT0, BIT1 or BIT2) of the state machine/successive approximation register 113.

Figure 2:
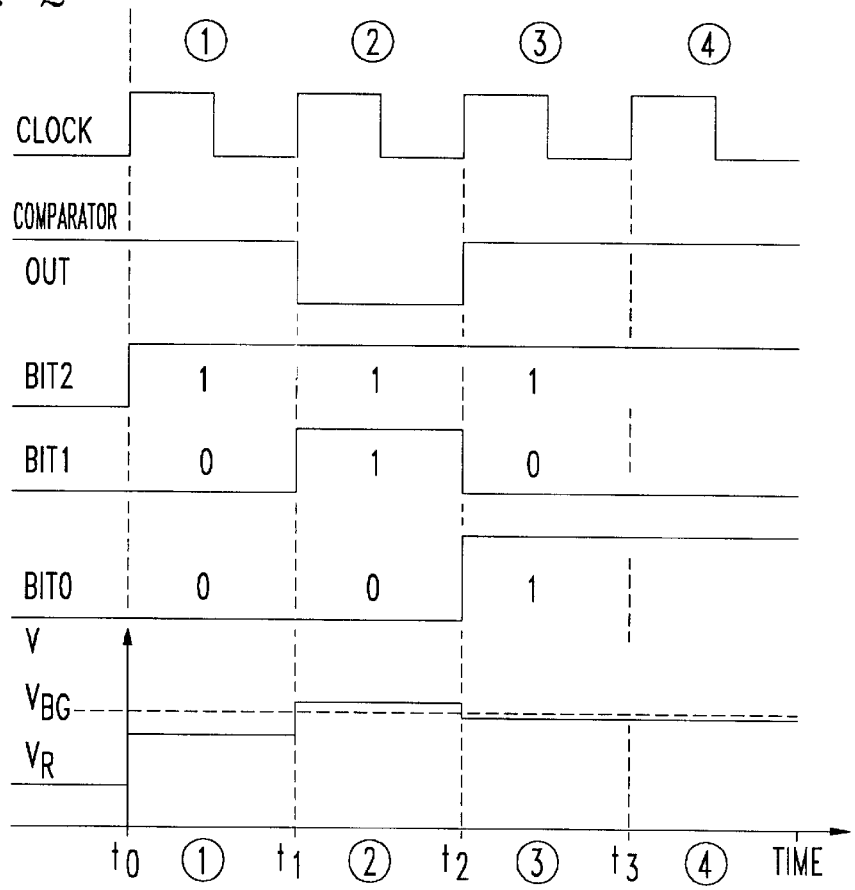
FIG. 2 shows a resistor calibration sequence with respect to clock pulses.

Referring to FIG. 2, an illustrative sequence of operations for calibrating the calibration resistor string is shown. Initially, the values in the successive approximation register, being BIT0, BIT1 and BIT2, are all "0". Therefore, that the outputs on lines 115, 116 and 117, are low, and the corresponding switches 107, 108 and 109 are closed. Therefore, the voltage $V_R$ at node 102 has a low value, being less than $V_{BG}$, and so the output of comparator 110 is high. Thereafter, the state machine 113 causes changes in the values in the successive approximation register outputs (BIT0, BIT1 and BIT2). Each change occurs at the rising edge of the clock pulse so as to cause the value of $V_R$ to converge toward $V_{BG}$, as in the illustrative sequence:

(1) At time $t_0$, the first rising clock edge causes BIT2 to go to "1". This places a high voltage on line 117, opening switch 109. Therefore, $V_R$ rises, but is still less positive than $V_{BG}$. Hence, the comparator output remains high.

(2) At time $t_1$, the second rising clock edge causes BIT1 to go to "1".

This places a high voltage on line 116, opening switch 108. Therefore, in this example, $V_R$ rises above $V_{BG}$, causing the comparator output to go low.

(3) At time $t_2$, the third rising clock edge causes BIT1 to go to "0" and BIT0 to go to "1", thereby closing switch 108 and opening switch 107. Therefore, $V_R$ decreases to a value that approximates $V_{BG}$ as closely as possible with the resistor string used.

The state machine 113 does not further change state during this calibration period. That is, there is no change of any of the bits in the successive approximation register at time $t_3$ and later, until the next calibration period begins (not shown). The number of allowed transitions of the bits in a given calibration period is typically set equal to the number of switches in the resister string, being three in the illustrative case. However, the state machine may be left running continuously if desired, although the value of $V_R$ then typically alternates above and below $V_{BG}$ as the comparator output switches between high and low. Still other state machine control techniques are possible. The calibration period may occur only once, as during IC power-up, but more typically occurs periodically during the operation of the IC. For example, the inventive technique is advantageously used in setting the filter coefficients in an IC that includes both disk drive read channel circuitry and a disk controller. In that case, the calibration period may conveniently occur as the disk read head is placed in the servo section of the disk. That allows the servo data tracks to provide the clock on line 114, and also allows setting the filter coefficients during a time that the filters are not active. The state machine may be designed according to techniques well known in the art.

Figure 3:
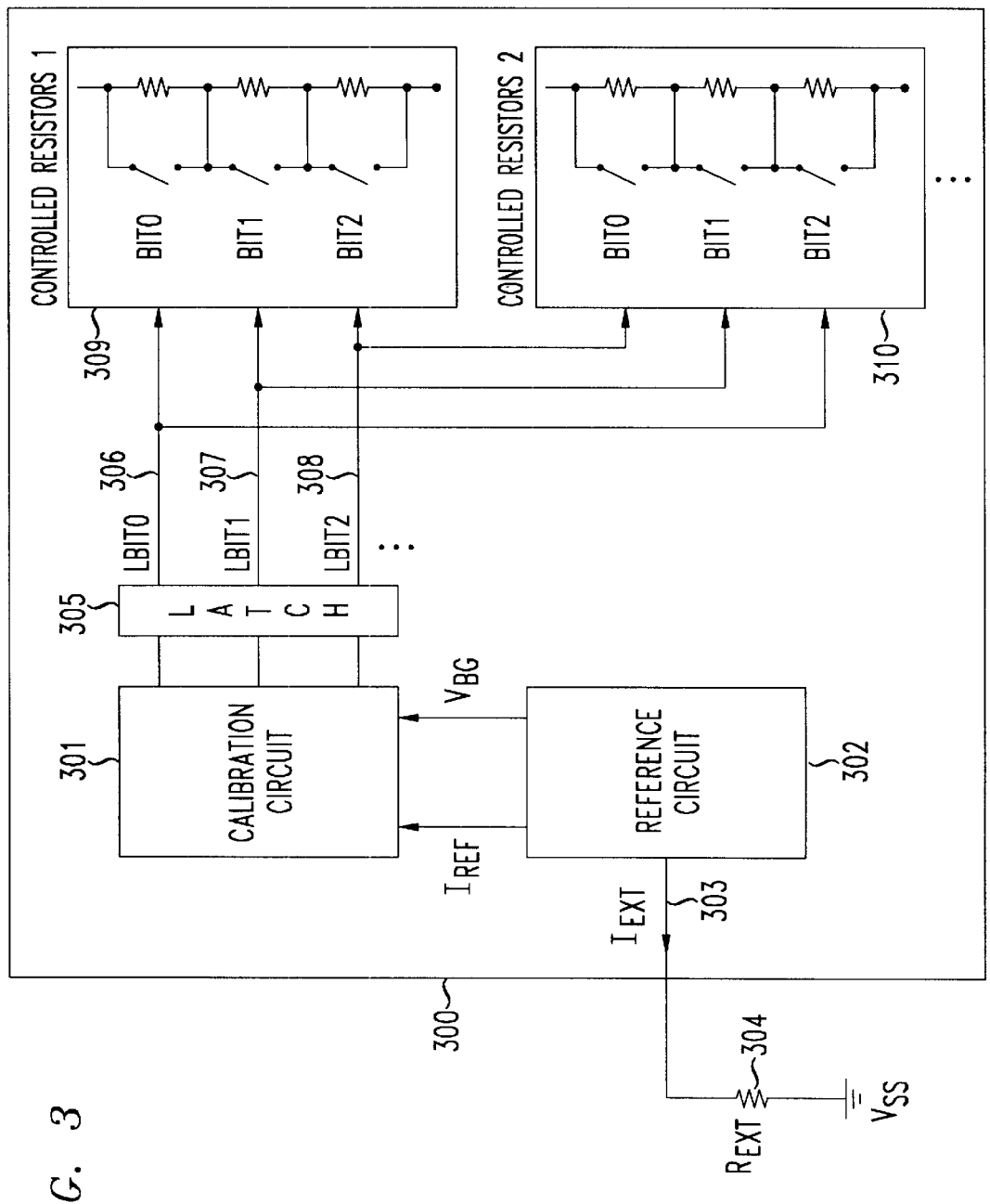
FIG. 3 shows an integrated circuit having a plurality of controlled resistors.

Referring to FIG. 3, it is seen how the present technique may be used to control several resistor strings on a given integrated circuit 300. The calibration circuit 301 comprises the calibration resistor string, comparator, and state machine/successive approximation register. The reference circuit 302 comprises a bandgap voltage source for generating $V_{BG}$ that is supplied to the calibration circuit. In addition, $V_{BG}$, or a scaled voltage proportional to $V_{BG}$, is applied to an external reference resistor 304 having a value $R_{EXT}$, causing a current $I_{EXT}$ to flow through resistor 304. The reference circuit 302 also includes means, typically a current mirror, for generating the reference current $I_{REF}$ so as to be proportional to $I_{EXT}$. Therefore, the values of $V_{BG}$ and $I_{REF}$ are also proportional, and their ratio is relatively temperature independent when an external reference resistor is used. The output of the calibration unit 301 (BIT0, BIT1 and BIT2) is applied to a latch circuit 305, which holds the value of the bits until the next calibration period. Therefore, the latched control bit values resulting from the most recent calibration (LBIT0, LBIT1 and LBIT2) are supplied to the various controlled resistors 309 and 310 via the control lines 306, 307 and 308, and the controlled resistors assume a value proportional to the value of the calibration resistor.

The voltage applied to the non-inverting comparator input may conveniently be generated by a bandgap voltage generator located on the same integrated circuit as the controlled resistors. One suitable bandgap design is shown in U.S. Pat. No. 4,849,684 co-assigned herewith, with various other reference voltage designs being known in the art, including those that do not rely on a semiconductor bandgap for a precise voltage generation. In addition, the comparator and state machine may be conveniently formed on the same integrated circuit as the reference voltage generator. However, as long as the reference current $I_{REF}$ is derived from the same voltage that is applied to the non-inverting comparator input, that voltage need not be a well-controlled "reference" voltage, but may vary with respect to temperature and power supply voltage, for example. This is because variations in this voltage will be reflected as a change in the common-mode voltage applied to the comparator, not as a change in the differential voltage across the comparator inputs.

Therefore, the calibration circuit will cause the calibrated resistors to assume a value proportional to the reference resistor, which is typically controlled within ±10 percent, and more typically within ±5 percent of the desired value, regardless of the absolute value of this voltage.

The reference current $I_{REF}$ is derived from a source that is relatively independent of the operating temperature of the integrated circuit on which the calibration resistors are formed. For this purpose, $I_{REF}$ may be derived by applying a voltage to a resistor that is external to the IC on which the calibration resistors are formed, as shown above. This usually provides better temperature independence than deriving the reference current solely from components on the IC chip. However, other techniques for generating a suitable reference current are possible, including on-chip techniques that may be considered relatively temperature independent.

Figure 4:
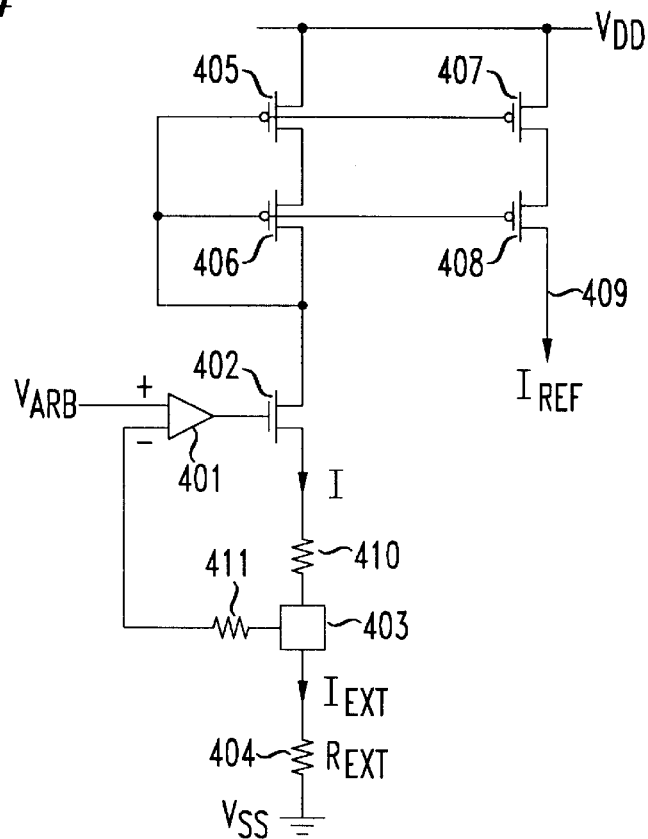
FIGS. 4 and 5 show embodiments of current and voltage sources suitable for use with the inventive technique.

Referring to FIG. 4, a first illustrative circuit for generating $I_{REF}$ is shown. The voltage $V_{ARB}$ is applied to the non-inverting input of operational amplifier 401, which controls the gate voltage of transistor 402. The source of 402 and the inverting input of 401 are connected to bondpad 403, which is also connected to external reference resistor 404 having a value $R_{EXT}$. The resistors 410 and 411 are optionally included for electrostatic discharge (ESD) protection, as is known in the art. Therefore, a current I (which is equal to $I_{EXT}$) flows through resistor 404, and is proportional to the voltage on bondpad 403 with respect to $V_{SS}$. Note that the voltage on bondpad 403 is caused to be equal to $V_{ARB}$ by the feedback to operational amplifier 401. The current I also flows through the channels of transistors 405 and 406. The reference current $I_{REF}$ is then generated by transistors 407 and 408, which form a current mirror with transistors 405–406, so that $I_{REF}$ is caused to be proportional to I, and hence to $V_{ARB}$. As indicated above, $V_{ARB}$ can be an arbitrary voltage that need not be particularly well controlled with respect to temperature, power supply or manufacturing process variations. However, $V_{ARB}$ is conveniently derived from the bandgap voltage reference in the illustrative case.

Figure 5:
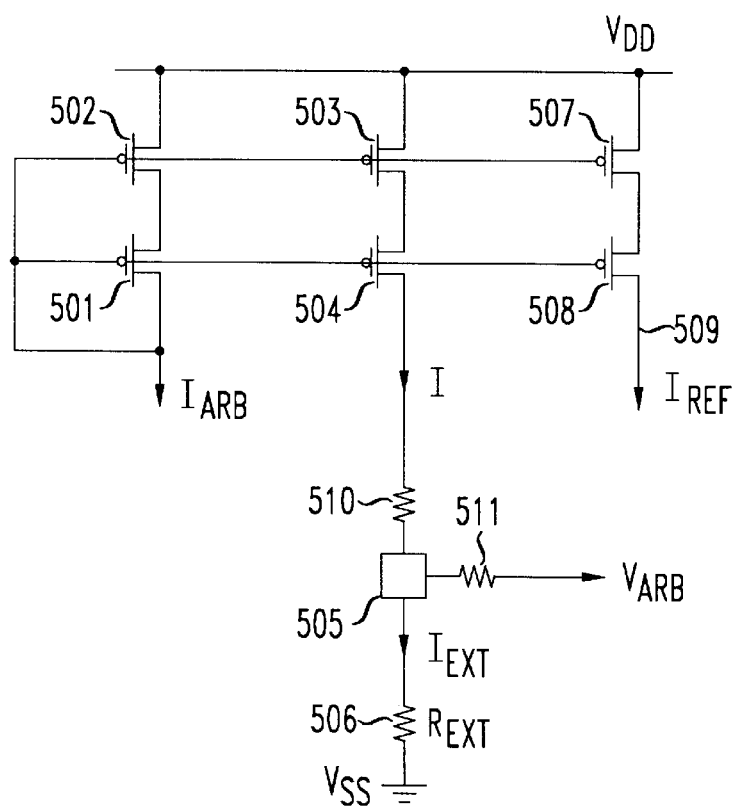

Referring to FIG. 5, a second illustrative circuit for generating $I_{REF}$ is shown. The current $I_{ARB}$ is caused to flow through transistors 501 and 502 by means of an arbitrary current source (not shown). The current $I_{ARB}$ is mirrored by transistors 503 and 504 to cause current I (=$I_{EXT}$) to flow through bondpad 505 and the external reference resistor 506 having a value $R_{EXT}$. The resistors 510 and 511 are optional for ESD protection, as above. The voltage $V_{ARB}$ is generated thereby, and is supplied to the comparator non-inverting input (FIG. 1). The current $I_{REF}$ is also generated by mirror transistors 507 and 508. Hence, $I_{REF}$ and $V_{ARB}$ are proportional to each other in this case also.

While the calibration resistor is typically implemented by a string of resistors, with at least one controlled switch in parallel with at least one resistor in the string, other forms of calibration resistance are possible. For example, a variable analog resistor may be used to implement the calibration resistor, with analog control of the gate voltage of a field effect transistor being one example of a variable analog resistor. In that case, the controlled resistances are then typically also controlled by an analog voltage. Other variations are possible.

The invention claimed is:

1. An integrated circuit comprising a source of a calibration voltage, a current mirror providing a constant current source of a calibration current that is proportional to said calibration voltage and which flows through a calibration resistor having a controllable resistance;

a comparator for comparing the calibration voltage to the voltage across said calibration resistor due to said calibration current;

and a control circuit for causing said calibration resistor to assume a resistance approximating the ratio of said calibration voltage to said calibration current;

and at least one controlled resistor that is controlled by said control circuit.

2. The integrated circuit of claim 1 wherein said calibration resistor comprises a string of resistors having at least one switch across at least one resistor in said string for varying the resistance of said string.

3. The integrated circuit of claim 1 wherein said current mirror is coupled to an external resistor so as to mirror the current flowing through said external resistor.

4. The integrated circuit of claim 1 wherein said source of a calibration voltage is a reference voltage source that is relatively constant with respect to changes in the temperature and operating voltage of said integrated circuit.

5. The integrated circuit of claim 4 wherein said reference voltage source is a bandgap reference source.

6. The integrated circuit of claim 1 wherein said control circuit comprises a state machine having a first input that is coupled to the output of said comparator, and a clock input coupled to a clock source, said state machine providing control bits to control said calibration resistor.

7. The integrated circuit of claim 1 wherein said control circuit further comprises a latch for latching the control bits from a successive approximation register in order to provide latched control bits to controlled resistors on said integrated circuit.

8. An integrated circuit comprising a voltage source, a current mirror providing a constant current source, a calibration resistor comprising a string of resistors having constant switches across at least some of said resistors, a comparator, and a clocked control circuit;

wherein said current mirror constant current source is connected to flow current that is proportional to the voltage from said voltage source through said calibration resistor so as to produce a voltage across said calibration resistor that is applied to a first input of said comparator, and said voltage source is connected to a second input of said comparator, and the output of said comparator is connected to an input of said clocked control circuit, and outputs of said clocked control circuit are coupled to said switches;

whereby said control circuit controls said switches so that the effective resistance of said calibration resistor assumes a value such that said voltage across said calibration resistor approximates the voltage from said voltage source.

9. The integrated circuit of claim 8 wherein the outputs of said clocked control circuit are also coupled to control the resistance of at least one string of controlled resistors.

10. A method of calibrating a resistor on an integrated circuit comprising:

flowing a calibration current from a constant current source current mirror through a calibration resistor having a controllable resistance, and comparing the voltage across said calibration resistor due to said calibration current to a calibration voltage that is proportional to said calibration current;

and causing said calibration resistor to assume a resistance approximating the ratio of said calibration voltage to said calibration current, and controlling at least one controlled resistor so as to assume a resistance proportional to that of said calibration resistor.

11. The method of claim 10 wherein said calibration resistor comprises a string of resistors having at least one switch across at least one resistor in said string for varying the resistance of said string.

12. The method of claim 10 wherein said current mirror is coupled to an external resistor so as to mirror the current flowing through said external resistor.

13. The method of claim 10 wherein said calibration voltage is provided by a reference voltage source that is relatively constant with respect to changes in the temperature and operating voltage of said integrated circuit.

14. The method of claim 13 wherein said reference voltage source is a bandgap reference source.

15. The method of claim 10 wherein said controlling of said controlled resistance is accomplished by a state machine having a first input that is coupled to the output of said comparator, and a clock input coupled to a clock source, said state machine providing control bits to control said calibration resistor.

16. The method of claim 10 wherein said controlling of a controlled resistance further comprises latching the control bits from said successive approximation register in order to provide latched control bits to said controlled resistors.

* * * * *